(12) United States Patent
Qiu et al.

(10) Patent No.: US 12,740,329 B2
(45) Date of Patent: Sep. 15, 2026

(54) SUPERCONDUCTING VACUUM-BRIDGED JOSEPHSON JUNCTIONS

(71) Applicant: IQM Finland Oy, Espoo (FI)

(72) Inventors: Wei Qiu, Espoo (FI); Wei Liu, Espoo (FI); Tianyi Li, Espoo (FI)

(73) Assignee: IQM Finland Oy, Espoo (FI)

( * ) Notice: Subject to any disclaimer, the term of this patent is extended or adjusted under 35 U.S.C. 154(b) by 376 days.

(21) Appl. No.: 18/371,685

(22) Filed: Sep. 22, 2023

(65) Prior Publication Data

US 2024/0107899 A1 Mar. 28, 2024

(30) Foreign Application Priority Data

Sep. 23, 2022 (FI) ..................................... 20225827

(51) Int. Cl.

| | |
|---|---|
| ***H10N 60/12*** | (2023.01) |
| ***H10N 60/01*** | (2023.01) |
| ***H10N 60/80*** | (2023.01) |
| ***H10N 69/00*** | (2026.01) |

(52) U.S. Cl.
CPC ......... *H10N 60/12* (2023.02); *H10N 60/0912* (2023.02); *H10N 60/805* (2023.02); *H10N 69/00* (2023.02)

(58) Field of Classification Search
None
See application file for complete search history.

(56) References Cited

U.S. PATENT DOCUMENTS

2016/0322693 A1 11/2016 Chang et al.
2017/0084813 A1 3/2017 Chang et al.
2018/0013052 A1* 1/2018 Oliver .................... H10N 60/12
2019/0065981 A1 2/2019 Chen et al.
2019/0164959 A1 5/2019 George et al.
2020/0028064 A1* 1/2020 Chang .................. H10N 60/805
2020/0043977 A1 2/2020 Adiga et al.
2021/0265261 A1 8/2021 Chan et al.
2021/0399199 A1* 12/2021 Adiga .................... H10N 60/12
2022/0140223 A1 5/2022 Deng et al.
2024/0095568 A1* 3/2024 Selvanayagam ........ H03F 19/00
2024/0099160 A1* 3/2024 Sato ................... H10N 60/0912
(Continued)

FOREIGN PATENT DOCUMENTS

EP 3869553 A1 8/2021

OTHER PUBLICATIONS

Borzenko et al., Metallic air-bridges fabricated by multiple acceleration voltage electron beam lithography, Microelectronic Engineering 75, pp. 210-215, 2004.
(Continued)

*Primary Examiner* — Nduka E Ojeh
(74) *Attorney, Agent, or Firm* — Meunier Carlin & Curfman LLC

(57) ABSTRACT

The invention relates to the field of superconducting integrated circuits. The invention includes an integrated circuit device comprising a substrate, a Josephson junction on the substrate, external electrodes on the substrate and spaced apart from the Josephson junction, and bridge connections connecting the Josephson junction to the external electrodes. The invention also includes a method for manufacturing such an integrated circuit device.

12 Claims, 7 Drawing Sheets

(56) References Cited

U.S. PATENT DOCUMENTS

2025/0331430 A1 * 10/2025 McDermott ........... G06N 10/70

OTHER PUBLICATIONS

Chu et al., Suspending superconducting qubits by solicon micromachining, Appl. Phys. Lett. 109, 10 pages, 2016.
Dunsworth et al., A Method for Building Low Loss Multi-Layer Wiring for Superconducting Microwave Devices, Appl. Phys. Lett. 112, 10 pages, 2018.
Dunsworth et al., Characterization and reduction of capacitive loss induced by sub-micron Josephson junction fabrication in superconducting qubits, Appl. Phys. Lett. 111, 4 pages, 2017.
Janzen et al., Aluminum air bridges for superconducting quantum devices realized using a single step electron-beam lithography process, Appl. Phys. Lett. 121, 5 pages, 2022.
Osman et al., Simplified Josephson-junction fabrication process for reproducibly high-performance superconducting qubits, Appl. Phys. Lett. 118, 7 pages, 2021.
Potts et al., CMOS compatible fabrication methods for submicron Joesphson junction qubits, IEE Proc.—Sci. Meas. Technol., vol. 148, No. 5, 2001.
Quintana et al., Characterization and reduction of microfabrication-induced decoherence in superconducting quantum circuits, Appl. Phys. Lett. 105, 5 pages, 2014.
Finnish Search Report issued in Finnish Application No. 20225827, mailed Apr. 4, 2023.
Zhu et al., Edge currents shunt the insulating bulk in gapped graphene, Nature Communications, vol. 8, 6 pages, 2017.
Sun et al., Fabrication of airbridges with gradient exposure, Appl. Phys. Lett. 121, 074001 (2022), 7 pages.
Extended European Search Report issued in corresponding EP App. No. 23198463.4 mailed Feb. 28, 2024 (4 pages).

* cited by examiner

SUPERCONDUCTING VACUUM-BRIDGED JOSEPHSON JUNCTIONS

TECHNICAL FIELD

The invention relates to the field of superconducting integrated circuits, in particular to superconducting devices including Josephson junctions, for example those used in quantum processing units.

BACKGROUND

Losses arising from interfaces between different materials in a superconducting device including a Josephson junction result in poorer performance of the Josephson junction. In particular, when the Josephson junction is used as part of a physical qubit, e.g. a transmon qubit, the losses lead to decreases qubit performance, including lower coherence time.

SUMMARY OF THE INVENTION

According to a first aspect of the invention, an integrated circuit device is provided. The integrated circuit device comprises a substrate, a Josephson junction on the substrate, external electrodes on the substrate and spaced apart from the Josephson junction, and bridge connections connecting the Josephson junction to the external electrodes.

The Josephson junction may be a component of a superconducting qubit. The superconducting qubit may be a transmon qubit, gmon qubit, or a fluxmon qubit. The integrated circuit device may be a quantum processing unit.

The Josephson junction may have been formed by shadow evaporation. The Josephson junction may be a cross type Josephson junction.

The Josephson junction may be an $Al/AlO_x/Al$ junction.

The Josephson junction may be spaced apart from the external electrodes such that no part of the Josephson junction is in direct contact with the external electrodes.

The Josephson junction may comprise a first layer and a second layer, a first bridge connection is in direct contact with the first layer of the Josephson junction and a first external electrode only, and a second bridge connection is in direct contact with the second layer of the Josephson junction and second external electrode only.

The first layer and second layer of the Josephson junction may comprise aluminium and a barrier layer disposed between the first layer and second layer may comprise aluminium oxide.

According to a second aspect of the invention, a method of fabricating an integrated circuit device is provided. The method comprises:

- forming a Josephson junction and external electrodes on a substrate such that the Josephson junction is spaced apart from the external electrodes;
- depositing a resist over the substrate, Josephson junction and external electrodes;
- patterning the resist such that contact pads on the Josephson junction and external electrodes are exposed, and such that the patterned resist between the contact pads defines bridge connection support portions;
- depositing a superconducting thin film over the resist such that the thin film is in direct electrical contact with the contact pads; and
- forming bridge connections by removing the resist and superconducting thin film except for the superconducting thin film deposited on the contact pads and over the bridge connection support portions.

Forming the external electrodes may comprise depositing a metal layer on the substrate and patterning the metal layer to form the external electrodes and expose the substrate in areas not covered by the external electrodes.

Forming the Josephson junction may comprise a double angle evaporation and lift-off process.

The resist may be patterned using electron beam lithography or extended photolithography.

The method may further comprise, prior to depositing the superconducting thin film, performing a wet-etch and/or dry-etch to clean the exposed contact pads.

Patterning the resist may comprise exposing a first contact pad on a first layer of the Josephson junction, exposing a second contact pad on a second layer of the Josephson junction, exposing a third contact pad on a first external electrode, and exposing a fourth contact pad on a second external electrode.

The patterned resist may comprise a first bridge connection support portion extending between the first contact pad and the third contact pad, and a second bridge connection support portion extending between the second contact pad and the fourth contact pad.

Forming bridge connections may comprises forming a first bridge connection over the first bridge connection support portion, the first bridge connection being in direct contact with the first layer of the Josephson junction and a first external electrode only and forming a second bridge connection over the second bridge connection support portion, the second bridge connection being in direct contact with the second layer of the Josephson junction and second external electrode only.

The Josephson junction may be spaced apart from the external electrodes such that no part of the Josephson junction is in direct contact with the external electrodes.

A first layer and second layer of the Josephson junction may comprise aluminium and a barrier layer disposed between the first layer and second layer may comprise aluminium oxide.

The method may further comprises forming further components of a superconducting qubit on the substrate.

According to a third aspect of the invention, an integrated circuit device is provided. The integrated circuit device is produced according to the method described above.

DETAILED DESCRIPTION OF THE INVENTION

Figure 1:
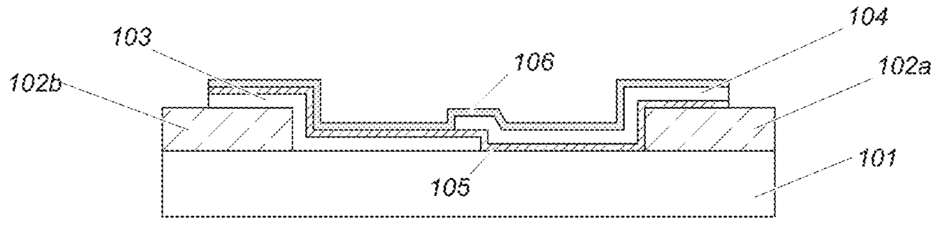
FIG. 1 is a cross section of a superconducting device including a Josephson junction formed by shadow evaporation according to the state of the art.

FIG. 1 is a cross section of a superconducting device including a Josephson junction, which is formed by a prior art shadow evaporation process. The Josephson junction is formed at the interface between a first layer 103, a barrier layer 105, and a second layer 104. The first and second layers 103, 104 extend away from the Josephson junction interface and are connected to external electrodes 102*a,* 102*b*. The external electrodes 102*a,* 102*b* are "external" to the Josephson junction in that they are not part of the Josephson junction per se, i.e. not the first layer, barrier layer, or second layer. However, the external electrodes 102*a,* 102*b* may be part of an integrated circuit component referred to as a "Josephson junction" in that they are used to form external connections, i.e. with other components. In other words, the first layer 103 and second layer 104 of the Josephson junction are connected to the external electrodes 102*a,* 102*b* and only to the external electrodes 102*a,* 102*b*. The first and second layers 103, 104, the barrier layer 105 and the external electrodes are located on a substrate 101, e.g. a silicon wafer. The upper surface of the barrier layer 105 and of the second layer 104 are covered by an oxidation layer 106. The first layer 103 of the Josephson junction may also be referred to as a "base electrode", and the second layer 104 of the Josephson junction may also be referred to as a "counter electrode".

Parasitic effects, e.g. two-level systems, that affect the performance of the Josephson junction arise at the interfaces between at least:

1) the external electrode 102*a* and the barrier layer 105
2) the external electrodes 102*a,* 102*b* and the substrate 101
3) the first layer 103 and the substrate 101
4) the first layer 103 and the external electrode 102*b*
5) the external electrodes 102*a,* 102*b* and surrounding gas, e.g. air
6) the barrier layer 105 and oxide(s) formed on the surface of the substrate 101.

The present invention includes an integrated circuit device employing bridge connections in order to remove or reduce the size of these interfaces, thereby reducing parasitic effects in the superconducting device by forming bridged electrodes 502*a,* 502*b* between the external electrodes 102*a,* 102*b* and the first and second layers 103, 104. The present invention also includes a method of manufacturing the device. The bridged electrodes 502*a,* 502*b* are depicted in detail in FIGS. 6A and 6B and a method of forming the bridged electrodes 502*a,* 502*b* is depicted in FIGS. 2A and 2B to FIGS. 5A and 5B.

Figure 2A:
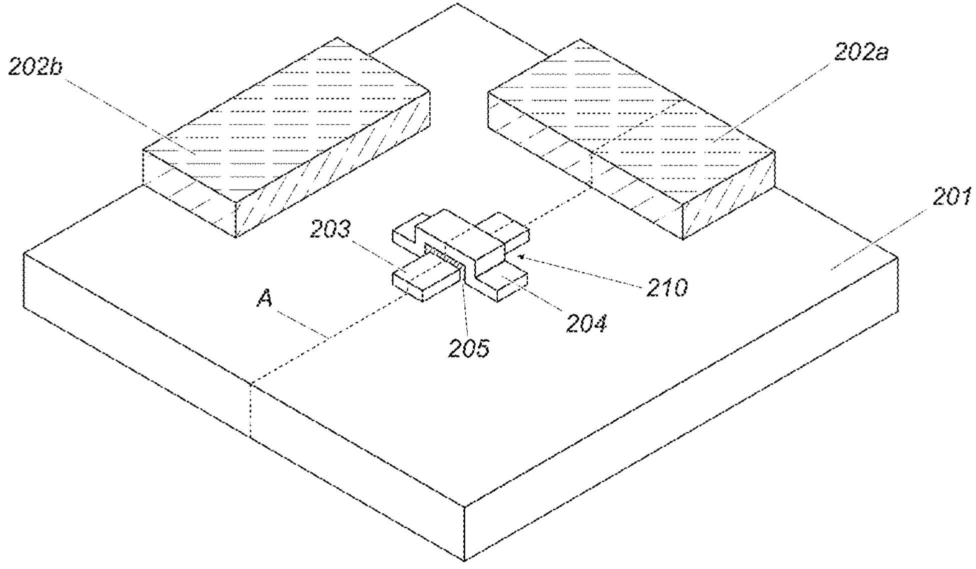
FIG. 2A is a perspective view of a substrate on which a Josephson junction has been formed by shadow evaporation.
Figure 2B:
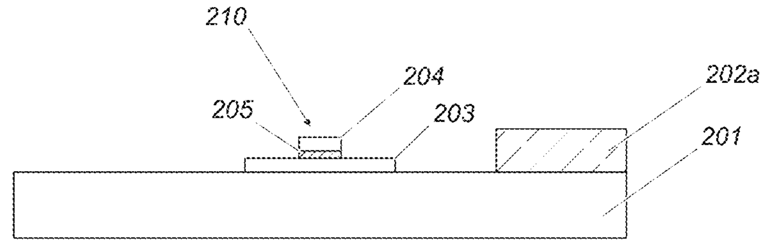
FIG. 2B is a cross-section of the structure shown in FIG. 2A.

FIGS. 2A and 2B show a first step of the method of manufacturing the integrated circuit device of the present invention. FIG. 2A is a perspective view of a substrate 201 on which a Josephson junction 210 has been fabricated by shadow evaporation, e.g. as described in *CMOS compatible fabrication methods for submicron Josephson junction qubits,* Potts, Parker, Baumberg & Groot, IEE Proceedings—Science, Measurement and Technology, vol. 148, pages 225-228, 2001. While the drawings depict a cross-type Josephson junction formed using a high aspect ratio resist, the method of the present invention can be applied to Josephson junctions formed by other methods, such as shadow evaporation using a suspended bridge (Niemeyer-Dolan technique) or by first forming a tri-layer including the first layer material, barrier material and second layer material and subsequently etching the tri-layer to form the Josephson junction 210.

The Josephson junction 210 is formed from a first layer 203, a barrier layer 205 and a second layer 204, also referred to as a second layer. Also formed on the substrate 201 are external electrodes 202*a* and 202*b,* to which the first layer 203 and second layer 204 of the Josephson junction 210 are connected by the bridge connections, which are formed in subsequent steps. The external electrodes 202*a,* 202*b* are "external" in the sense that they are used to form connections between the Josephson junction 210 and other electronic components or other circuits elements. The external electrodes 202*a,* 202*b* are external to the Josephson junction 210 in that they are not part of the Josephson junction 210 per se, i.e. they are not an integral part of the first layer 203 or second layer 204. However, the external electrodes 202*a,* 202*b* are used to form external connections to the Josephson junction 210, i.e. with other components. In other words, the first layer 203 and second layer 204 of the Josephson junction 210 are connected to the external electrodes 202*a,* 203*b* and only to the external electrodes 202*a,* 203*a*. The Josephson junction 210 may be spaced apart from the external electrodes 202*a,* 202*b* such that no part of the Josephson junction 210 is in direct contact with the external electrodes 202*a,* 202*b*. The first and second layers 203, 204 of the Josephson junction 210 may only be connected to other electronic components or other circuit elements via the external electrodes 202*a,* 202*b*. The first layer 203 of the Josephson junction 210 may be referred to as a "base electrode", and the second layer 204 of the Josephson junction 210 may be referred to as a "counter electrode".

FIG. 2B is a cross-section of the structure of FIG. 2A taken along the dashed line A.

Figure 3A:
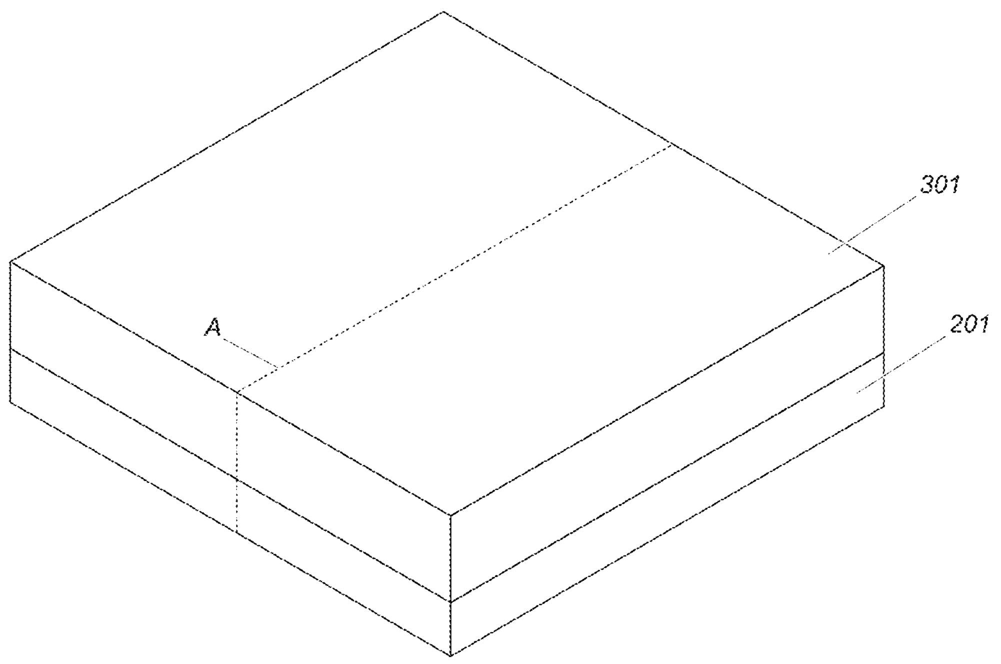
FIG. 3A is a perspective view of the substrate of FIG. 2A after a resist has been formed on the upper surface.
Figure 3B:
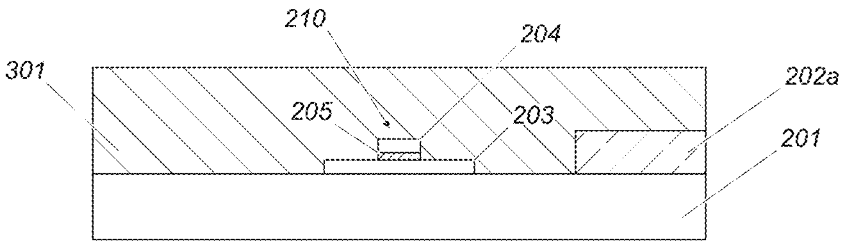
FIG. 3B is a cross-section of the structure shown in FIG. 3A.

FIG. 3A is a perspective view of the substrate of FIG. 2A after a resist 301 has been formed on the upper surface. FIG. 3B is a cross-section of the structure shown in FIG. 3A taken along the dashed line A.

Figure 4A:
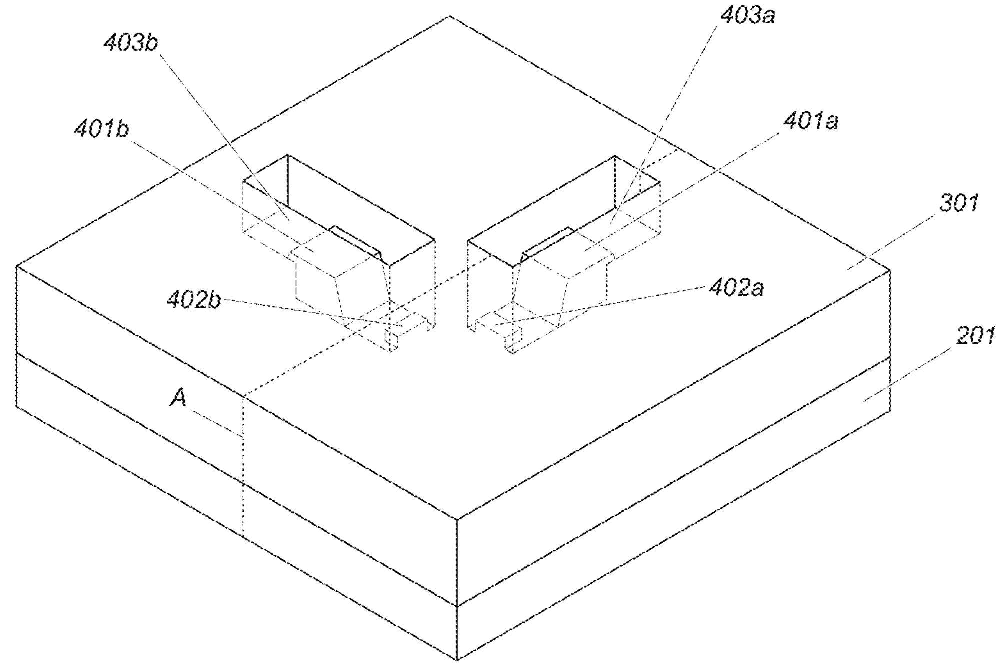
FIG. 4A is a perspective view of the substrate and resist shown in FIG. 3A after bridge connection support portions have been formed in the resist.

FIG. 4A is a perspective view of the substrate 201 and resist 301 shown in FIG. 3A after bridge connection support portions 401*a,* 401*b* have been formed in the resist 301. The bridge connection support portions 401*a,* 401*b* are formed by selectively removing resist material, for example by electron beam lithography or extended photolithography, to expose contact pads 402*a,* 402*b* on the first and second layers 203, 204 and 403*a,* 403*b* on the external electrodes 202*a,* 202*b*. Extended photolithography is described in Yuting Sun, Jiayu Ding, Xiaoyu Xia, Xiaohan Wang, Jianwen Xu, Shuqing Song, Dong Lan, Jie Zhao, and Yang Yu, "Fabrication of airbridges with gradient exposure", Appl. Phys. Lett. 121, 074001 (2022).

First exposed Josephson junction contact pad 402*a* exposes a portion of the Josephson junction first layer 203 through the resist 301. Second exposed Josephson junction contact pad 402*b* exposes a portion of the Josephson junction second layer 204 though the resist 301. First exposed external electrode contact pad 403*a* exposes a portion of the first external electrode 202*a* through the resist 301. Second exposed external electrode contact pad 403*b* exposes a portion of the second external electrode 202*b* through the resist 301.

Bridge connection support portion 401*a* extends between the first exposed Josephson junction contact pad 402*a* and the first exposed external electrode contact pad 403*a*. Bridge connection support portion 401*b* extends between the second exposed Josephson junction contact pad 402*b* and the second exposed external electrode contact pad 403*b*.

The bridge connection support portions 401*a,* 401*b* define a trapezoidal shape with sloped sidewalls adjacent to the exposed contact pads 402*a,* 402*b,* 403*a* and 403*b*. The upper surface of the bridge connection support portions 401*a,* 401*b* is depicted as parallel to the surface of the substrate 201 and the surface of the resist 301, but this is not essential.

After the bridge connection support portions 401*a,* 401*b* and exposed contact pads 402*a,* 402*b,* 403*a,* 403*b* have been formed, a further wet etch or dry etch is performed in order to clean the exposed contact pads. A combination of wet and dry etching may alternatively be used to clean the exposed contact pads.

Figure 4B:
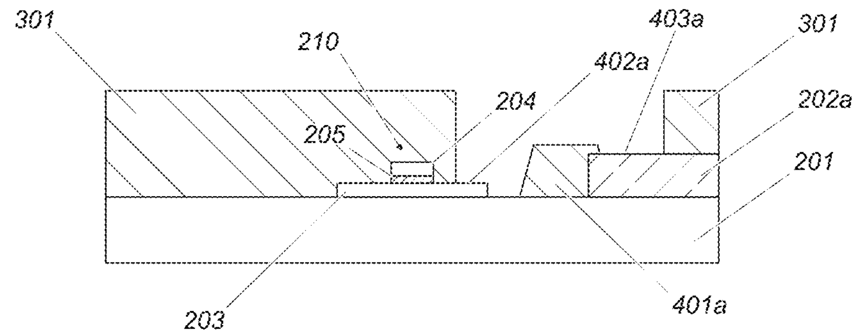
FIG. 4B is a cross-section of the structure shown in FIG. 4A.

FIG. 4B is a cross-section of the structure shown in FIG. 4A taken along the dashed line A.

Figure 5A:
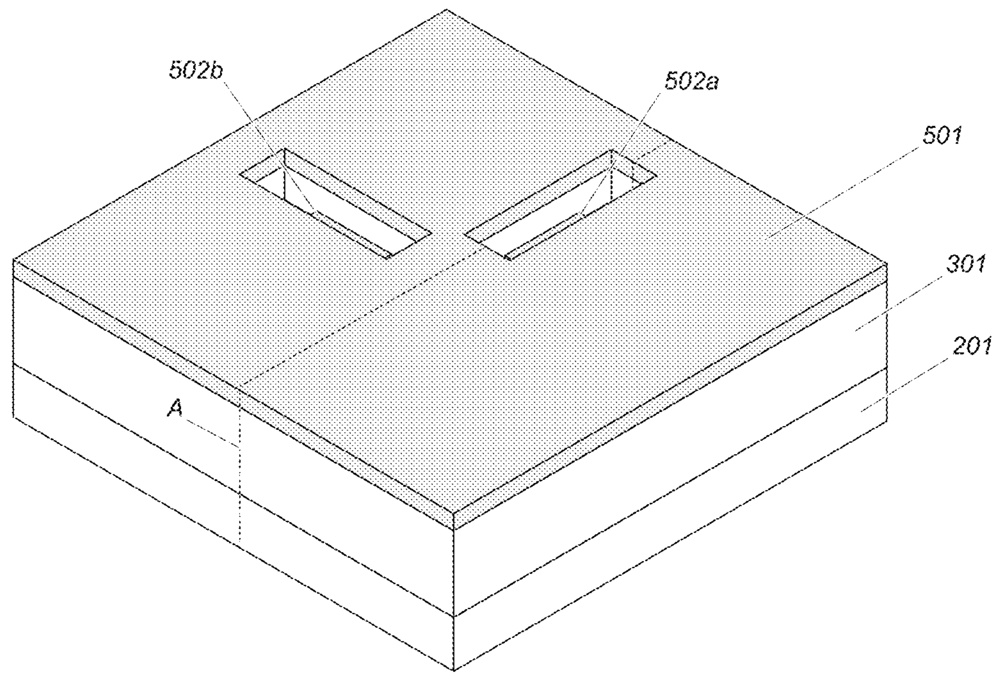
FIG. 5A is a perspective view of the substrate and resist shown in FIG. 4A after deposition of a superconducting thin film over the, resist and bridge connection support portions and exposed contact pads.

FIG. 5A is a perspective view of the substrate 201 and resist 301 shown in FIG. 4A after deposition of a superconducting thin film 501 over the resist 301, bridge connection support portions 401*a,* 401*b* and exposed contact pads 402*a,* 402*b,* 403*a,* 403*b* (shown in FIGS. 4A and 4B). The superconducting thin film may an aluminium thin film or any other suitable superconducting material. The superconducting thin film may be deposited by physical vapour deposition or chemical vapour deposition. Physical vapour deposition (sputtering) is preferred.

Figure 5B:
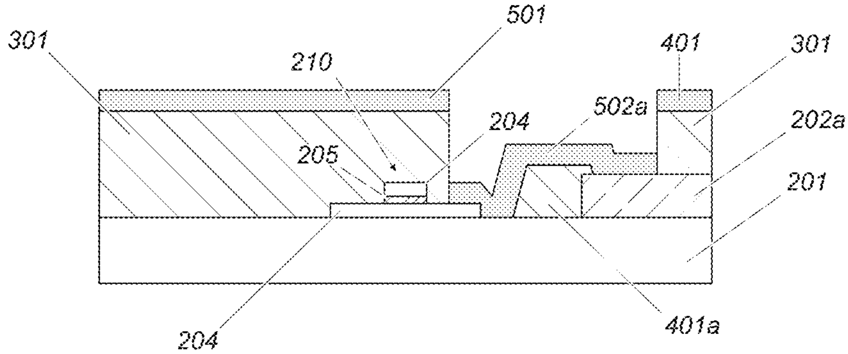
FIG. 5B is a cross-section of the structure shown in FIG. 5A.

FIG. 5B is a cross-section of the structure shown in FIG. 5A taken along the dashed line A. As can be seen in FIG. 5B, the superconducting thin film is deposited within the opening in the resit 301 where the bridge connection support portion 401*a* is formed, creating a superconductive (when the superconducting material is below the critical temperature) connection 502*a* between the Josephson junction first layer 203 and the first external electrode 202*a*. Similarly, the superconducting thin film is also deposited within the opening in the resit 301 where the bridge connection support portion 401*b* is formed, creating a superconductive (when the superconducting material is below the critical temperature) connection 502*b* between the Josephson junction second layer 204 and the second external electrode 202*b*.

The shape of the superconductive connections 502*a,* 502*b* conforms to the shape of the exposed contact pads 402*a,* 402, 403*a,* 403*b* and bridge connection support portions 401*a,* 401*b*.

Figure 6A:
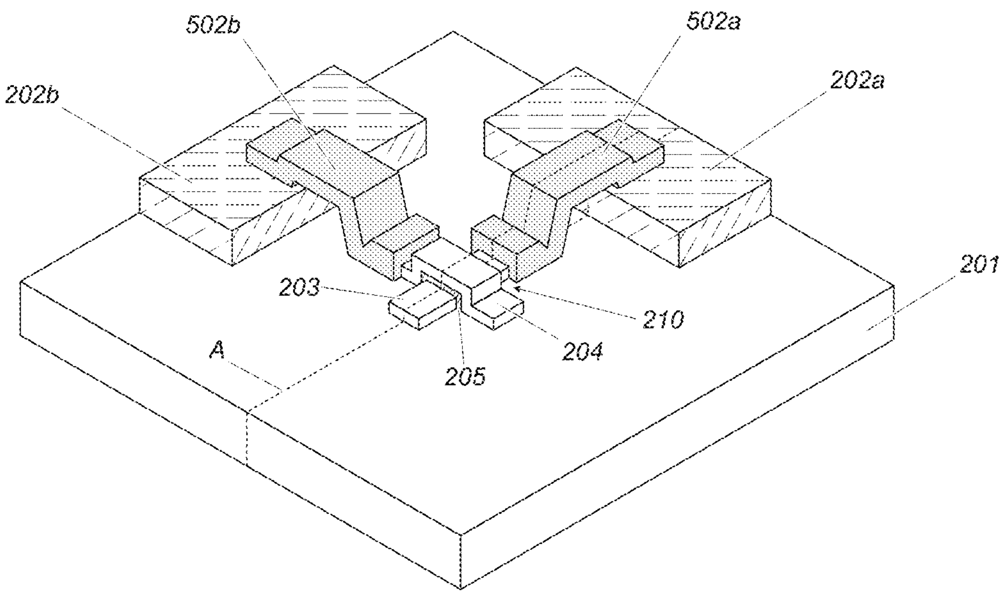
FIG. 6A is a perspective view of the substrate, Josephson junction and bridge connections after lift-off of the resist and superconducting thin film.
Figure 6B:
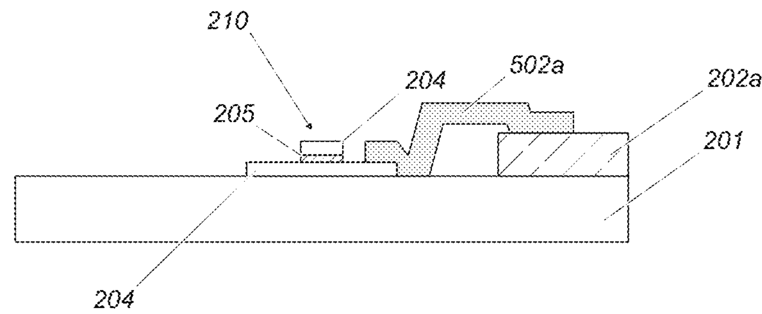
FIG. 6B is a cross-section of the structure shown in FIG. 6A.

After deposition of the superconducting thin film, the resist 301, including bridge connection support portions 401*a,* 401*b* are removed for example using a suitable solvent. When the resist 301 is removed, the superconducting thin film 501 on top of the resist is no longer connected to the substrate 201 and it also removed. When the bridge connection support portions 401*a,* 401*b* are removed, the superconductive connections 502*a,* 502*b* remain connected to at least the first and second layers 203, 204 of the Josephson junction 210 and to the external electrodes 202*a,* 202*b*. Removal of the bridge connection support portions 401*a,* 401*b* therefore leaves a gap between the superconductive connections 502*a,* 502*b* and the substrate 201, the gap being located between the first and second layers 203, 204 of the Josephson junction 210 and the external electrodes 202*a,* 202*b,* as shown in FIGS. 6A and 6B. Specifically, a portion of the superconductive connection 502*a* is suspended above and separated from the substrate 201 between the Josephson junction first layer 203 and the external electrode 202*a.* The superconductive connection 502*a* thereby forms a first bridge connection 502*a.* Similarly, a portion of the superconductive connection 502*b* is suspended above and separated from the substrate 201 between the Josephson junction second layer 204 and the external electrode 202*b.* The superconductive connection 502*b* thereby forms a second bridge connection 502*b.*

FIG. 6A is a perspective view of the substrate 201, the Josephson junction 210 and the bridge connections 502*a,* 502*b* after lift-off of the resist 301, the bridge support portions 401*a,* 401*b* and the superconducting thin film 501. FIG. 6B is a cross-section of the structure shown in FIG. 6A taken along the dashed line A.

Figure 7:
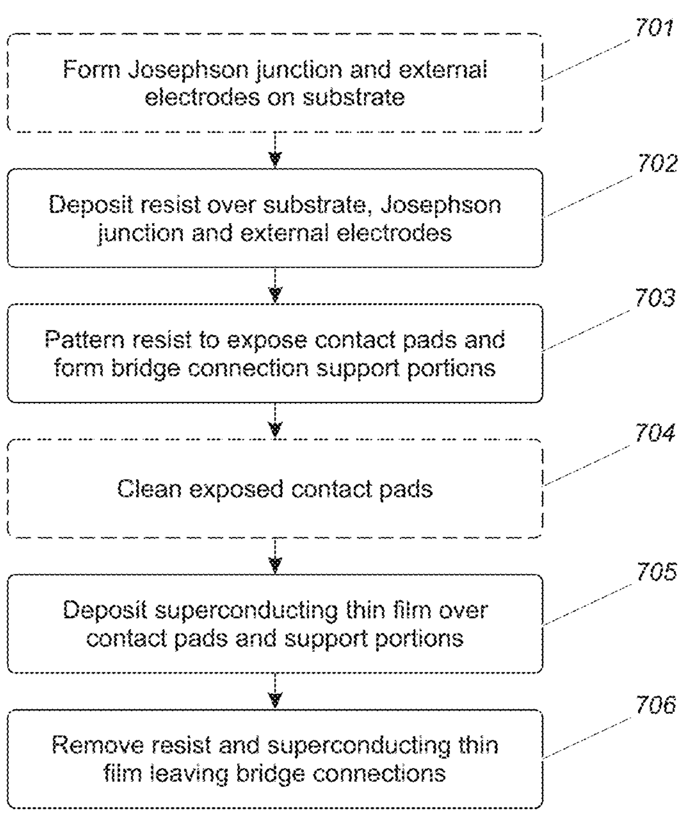
FIG. 7 is a flow diagram depicting the method of manufacturing a semiconductor device shown in FIGS. 2A and 2B to FIGS. 6A and 6B.

FIG. 7 is a flow diagram depicting a method of manufacturing an integrated circuit device according to the present invention. At step 701, a Josephson junction 210 and external electrodes 202*a,* 202*b* are fabricated on a substrate 201. The end result of step 701 corresponds to the structure shown in FIGS. 2A and 2B. Step 701 may be performed as part of the method of the present invention, or it may be performed separately before the method of the present invention begins at step 702.

At step 702, a resist is deposited over the substrate 201, the Josephson junction layers 203, 204, 205 and the external electrodes 202*a,* 202*b.* The end result of step 702 is depicted in FIGS. 3A and 3B.

At step 703, the resist is patterned to expose contact pads on the first layer 203 of the Josephson junction 210, the second layer 204 of the Josephson junction 210, the first external electrode 202*a* and the second external electrode 202*b.* The resist is also patterned to form the bridge connection support portions 401*a* and 401*b,* which are formed from the resist material by selectively removing the resist material to create the shape of the bridge connections support portions 401, 401*b.* Patterning the resist may be performed using electron beam lithography, extended photolithography, or any other suitable technique. The contact pads may be exposed and the bridge connection support structures formed in a single patterning step or across multiple distinct steps. The arrangement of the exposed contact pads 402*a,* 402*b,* 403*a* and 403*b* and bridge connection support portions 401*a,* 401*b* are described in more detail above with respect to FIGS. 4A and 4B which depict the end result of step 703.

At step 704, the method may include a separate step of cleaning the exposed contact pads, for example by wet etching, dry etching, or a combination of wet and dry etching. Depending on the technique used to pattern the resist in step 703, cleaning the exposed contact pads may be unnecessary, in which case it may not form part of the method.

At step 705, a superconducting thin film is deposited over the resist 301, including the bridge connection support portions 401*a,* 401*b,* and the exposed contact pads 402*a,* 402*b,* 403*a,* 403*b.* The end result of step 705 is depicted in FIGS. 5A and 5B and described in more detail above.

At step 706, the resist is removed, e.g. using a solvent, which causes the parts of the superconducting thin film 501 formed on top of the resist 301 to also be removed, while leaving behind the bridge connection structures 502*a*, 502*b*, which are connected to the exposed contact pads 402*a*, 402*b*, 403*a* and 403*b* as described above with respect to FIGS. 5A, 5B, 6A and 6B. FIGS. 6A and 6B depict the end result of step 706, which is described in more detail with respect to those drawings.

The invention claimed is:

1. A method of manufacturing an integrated circuit device, the method comprising:

forming a Josephson junction and external electrodes on a substrate such that the Josephson junction is spaced apart from the external electrodes;

depositing a resist over the substrate, the Josephson junction and the external electrodes;

patterning the resist such that contact pads on the Josephson junction and the external electrodes are exposed, and such that the patterned resist between the contact pads defines bridge connection support portions;

depositing a superconducting thin film over the resist such that the superconducting thin film is in direct electrical contact with the contact pads; and forming bridge connections by removing the resist and the superconducting thin film except for the superconducting thin film deposited on the contact pads and over the bridge connection support portions.

2. The method of claim 1, wherein forming the external electrodes comprises depositing a metal layer on the substrate and patterning the metal layer to form the external electrodes and expose the substrate in areas not covered by the external electrodes.

3. The method of claim 1, wherein forming the Josephson junction comprises a double angle evaporation and lift-off process.

4. The method of claim 1, wherein the resist is patterned using electron beam lithography or extended photolithography.

5. The method of claim 1, wherein the method further comprises, prior to depositing the superconducting thin film, performing a wet-etch and/or dry-etch to clean the exposed contact pads.

6. The method of claim 1, wherein patterning the resist comprises exposing a first contact pad on a first layer of the Josephson junction, exposing a second contact pad on a second layer of the Josephson junction, exposing a third contact pad on a first external electrode, and exposing a fourth contact pad on a second external electrode.

7. The method of claim 6, wherein the patterned resist comprises a first bridge connection support portion extending between the first contact pad and the third contact pad, and a second bridge connection support portion extending between the second contact pad and the fourth contact pad.

8. The method of claim 7, wherein forming the bridge connections comprises:

forming a first bridge connection over the first bridge connection support portion, the first bridge connection being in direct contact with the first layer of the Josephson junction and the first external electrode only; and forming a second bridge connection over the second bridge connection support portion, the second bridge connection being in direct contact with the second layer of the Josephson junction and the second external electrode only.

9. The method of claim 1, wherein the Josephson junction is spaced apart from the external electrodes such that no part of the Josephson junction is in direct contact with the external electrodes.

10. The method of claim 1, wherein a first layer and second layer of the Josephson junction comprise aluminium and wherein a barrier layer disposed between the first layer and second layer comprises aluminium oxide.

11. The method of claim 1, wherein the method further comprises forming further components of a superconducting qubit on the substrate.

12. An integrated circuit device produced by:

forming a Josephson junction and external electrodes on a substrate such that the Josephson junction is spaced apart from the external electrodes;

depositing a resist over the substrate, the Josephson junction and the external electrodes;

patterning the resist such that contact pads on the Josephson junction and the external electrodes are exposed, and such that the patterned resist between the contact pads defines bridge connection support portions;

depositing a superconducting thin film over the resist such that the superconducting thin film is in direct electrical contact with the contact pads; and forming bridge connections by removing the resist and the superconducting thin film except for the superconducting thin film deposited on the contact pads and over the bridge connection support portions.

* * * * *